(12) United States Patent
Khandros et al.

(10) Patent No.: US 6,840,374 B2
(45) Date of Patent: Jan. 11, 2005

(54) APPARATUS AND METHOD FOR CLEANING TEST PROBES

(76) Inventors: Igor Y. Khandros, 25 Haciendas Rd., Orinda, CA (US) 94563; Benjamin N. Eldridge, 651 Sheri La., Danville, CA (US) 94526; Treliant Fang, 11444 Rothschild Pl., Dublin, CA (US) 94568; Gaetan L. Mathieu, 659 Orange Way, Livermore, CA (US) 94550; Gary W. Grube, 6807 Singletree Ct., Pleasanton, CA (US) 94588; Michael A. Drush, 23443 Rancho Ramon Ct., Tracy, CA (US) 95304; Christopher C. Buckholtz, 118 Martin Ave., Livermore, CA (US) 94550

( * ) Notice: Subject to any disclaimer, the term of this patent is extended or adjusted under 35 U.S.C. 154(b) by 0 days.

(21) Appl. No.: 10/050,908

(22) Filed: Jan. 18, 2002

(65) Prior Publication Data

US 2003/0138644 A1 Jul. 24, 2003

(51) Int. Cl.[7] .......................... B65D 69/00; B32B 5/00; B32B 9/04
(52) U.S. Cl. .................. 206/223; 428/447; 428/450; 428/145; 428/688
(58) Field of Search .................. 428/446, 447, 428/448, 450, 454, 145, 688; 427/307, 308, 309; 206/223

(56) References Cited

U.S. PATENT DOCUMENTS

| | | | |
|---|---|---|---|
| 4,757,255 A | 7/1988 | Margozzi | 324/158 F |
| 4,774,111 A * | 9/1988 | Lo | 427/387 |
| 4,778,326 A | 10/1988 | Althouse et al. | 414/786 |
| 4,954,774 A | 9/1990 | Binet | 324/158 F |
| 5,198,752 A | 3/1993 | Miyata et al. | 324/158 F |
| 5,198,753 A | 3/1993 | Hamburgen | 324/158 F |
| 5,220,279 A | 6/1993 | Nagasawa | |
| 5,476,211 A | 12/1995 | Khandros | 228/180.5 |
| 5,568,054 A | 10/1996 | Iino et al. | 324/760 |
| 5,690,749 A | 11/1997 | Lee | 134/6 |
| 5,834,946 A | 11/1998 | Albrow et al. | 324/760 |
| 5,917,707 A | 6/1999 | Khandros et al. | 361/776 |
| 6,056,627 A | 5/2000 | Mizuta | 451/59 |
| 6,110,823 A | 8/2000 | Eldridge et al. | 438/660 |
| 6,130,104 A * | 10/2000 | Yamasaka | 438/14 |
| 6,140,616 A | 10/2000 | Andberg | 219/444.1 |
| 6,169,409 B1 | 1/2001 | Amemiya | 324/754 |
| 6,184,053 B1 | 2/2001 | Eldridge et al. | 438/52 |
| 6,255,126 B1 | 7/2001 | Mathieu et al. | 438/15 |

FOREIGN PATENT DOCUMENTS

| | | |
|---|---|---|
| WO | WO 95/14314 | 5/1995 |
| WO | WO 96/17378 | 6/1996 |
| WO | WO 00/33089 | 6/2000 |
| WO | WO 01/08819 A1 | 2/2001 |

* cited by examiner

*Primary Examiner*—Philip Tucker
*Assistant Examiner*—Michael J Feely

(57) ABSTRACT

A probe cleaning apparatus for cleaning a probe tip use to test semiconductors dies having an abrasive substrate layer an a tacky gel layer on top of the abrasive surface of the abrasive substrate layer. The probe tip is cleaned by passing it through the tacky gel layer so that it comes in contact with the abrasive surface of the abrasive substrate, moving the probe tip across the abrasive surface of the substrate layer, and then removing the probe tip from the successive layers of the cleaning apparatus. The probe tip emerges from the cleaning apparatus free from debris associated with testing the semiconductor dies.

64 Claims, 9 Drawing Sheets

APPARATUS AND METHOD FOR CLEANING TEST PROBES

BACKGROUND OF THE INVENTION

1. Field of the Invention

The present invention relates generally to probe cards that are used to perform tests on semiconductor devices. The present invention more particularly relates to the cleaning of probe elements that extend from such probe cards.

2. Background Art

Individual semiconductor (integrated circuit) devices (dies) are typically produced by creating several identical dies on a semiconductor wafer, using known techniques of photolithography, deposition, and the like. Generally, these processes are intended to create a plurality of fully-functional integrated circuit devices, prior to singulating (severing) the individual dies from the semiconductor wafer. In practice, however, certain physical defects in the wafer itself and certain defects in the processing of the wafer inevitably lead to some of the dies being "good" (fully-functional) and some of the dies being "bad" (non-functional). It is generally desirable to be able to identify which of the plurality of dies on a wafer are good dies prior to their packaging, and preferably prior to their being singulated from the wafer. To this end, a wafer "tester" and "prober" in combination with a probe card may advantageously be employed to make a plurality of discrete pressure connections to a like plurality of discrete connection pads (bond or contact pads) on the dies. In this manner, the semiconductor dies can be tested and exercised, prior to singulating the dies from the wafer. A conventional component of a wafer test cell is a "probe card" to which a plurality of probe elements are connected, wherein the tips of the probe elements effect the pressure connections to the respective pads of the semiconductor dies.

More specifically, in the typical wafer testing process, the probe card is mounted to the prober, and probe elements (simply referred to as "probes") extending from the probe card are brought into contact with pads formed on the dies of the wafer. Nonexclusive examples of such probes include elastic or springy contact probes (often referred to as "spring contacts" or "contact springs"), such as those disclosed in U.S. Pat. No. 6,184,053, entitled "Method of Making Microelectronic Spring Contact Elements," U.S. Pat. No. 5,476,211, entitled "Method for Manufacturing Electrical Contacts, Using a Sacrificial Member," U.S. Pat. No. 5,917,707, entitled "Flexible Contact Structure with an Electrically Conductive Shell," U.S. Pat. No. 6,110,823, entitled "Method of Modifying the Thickness of a Plating on a Member by Creating a Temperature Gradient on the Member, Applications for Employing Such a Method, and Structures Resulting from Such a Method," U.S. Pat. No. 6,255,126, entitled "Lithographic Contact Elements", and PCT Publication No. WO 00/33089, entitled "Lithographic Contact Elements," all of which are incorporated herein by reference.

In one process, an electrical connection between the prober and the pads is achieved by applying a predetermined pressure to the probes after the probes have been brought into contact with the pads so that the probes penetrate the material forming the surface of the pads and come into low-resistance contact with the portions forming the bodies of the pads. Upon contact and penetration of the pad material by the probe tips, the transfer of the pad material to the probe tips may contaminate the probe elements. The transferred contaminants may include the original pad material or an oxide of the pad material. It is possible that, depending on the transient operating conditions, the pad material may become alloyed (i.e., fused) to the probe tip material.

Alternatively, penetration of the pad surface material by the probe tips may produce debris (e.g., metallic chips) that is sometimes subsequently removed. Typically, elastic or springy probes are used to obtain a solid electrical connection between the prober and pads by compressing the probes with a predetermined pressure after the probes have been brought into contact with the pads. Once compressed, some contact technologies require that the probes are subjected to a slight X- and optionally Y-direction swipe, which causes a portion of the material forming the surface of the pads (e.g., a metallic oxide film) to be scraped off, thereby producing debris in the form of, for example, metallic "shavings" which may have an oxide film. This scraping movement across the pad surface also may produce "chips" of debris (e.g., metallic and/or oxide films) made of the material forming the surface of the pads. Even non-wiping contacts may become contaminated during probing, both by material transfer and/or alloying, as well as by adhering of loose particles of debris to the side of the probe element.

Foreign debris is not limited to only metal shavings and/or metal oxide chips, however, but may also include matter such as dust, polymeric or metallic oxide by-products resulting from the various process performed on wafers associated with the building of integrated circuits, or any other material that may interfere with obtaining a proper electrical connection between the probe tip and the die surface, or proper positioning of the probe itself in relation to the die. Various measures have been taken to prevent problems in achieving a satisfactory electrical contact between probes and pads, which include cleaning of the probe tips between die testing cycles.

In one conventional probe cleaning process, an abrading pad is used to remove foreign materials adhering to probes tips. The abrading pad can be composed of a mixture of an elastic base material and abrasive particles. Alternatively, the abrading pad can be composed of tungsten carbide. Foreign materials adhering to the tips of the probes are scraped off of the tips by repeating a cleaning cycle of pressing-and-extracting the tips of the probes against (and optionally into) the pad. The pressing-and-extracting cleaning cycle includes moving the abrading pad vertically (e.g., in the Z direction) against the probes, and then vertically away from the probes.

A disadvantage of the above described conventional cleaning process is that the portions of base material (e.g., silicone rubber) and/or abrasive particles (e.g., abrasive grains) may fall or chip off the abrading pad during the pressing-and-extracting process, thereby producing additional foreign material that may stick to the probe tips. Further, foreign matter (previously removed from probe) that has fallen onto the abrading pad may later stick to the probes being cleaned. Accordingly, additional cleaning steps may be necessary to acceptably clean the probes.

Additional steps may include blowing an organic solvent against the probes, and then blowing dry air against the probes. The use of such solvents is undesirable for many reasons. For example, the blowing of an organic solvent is time consuming and may be messy or hazardous. Additionally, blowing of dry air is time consuming. Further, special equipment is required to blow the solvents and the dry air. Fine brushes have also been used to clean probes.

Another attempt to improve upon the conventional probe cleaning process includes using a polymeric covered substrate to remove foreign materials following the pressing-and-extracting cleaning cycle described above. More specifically, a gel pad is positioned under the probes and then brought into contact with the probes, in a manner similar to the pressing-and-extracting used with the above-described abrading pad. Debris that has been loosened or produced by the abrading pad, therefore, sticks to the gel pad and is thereby removed from the probes. A disadvantage of this cleaning process is that an operator must typically swap the abrading pad with the gel pad during the cleaning process, because testing systems typically include only one auxiliary tray for holding such pads. This is undesirable because it prevents wafer testing from being a completely automated process, thereby significantly reducing wafer testing throughput.

Accordingly, there is a need for improved methods and apparatuses for cleaning probes.

BRIEF SUMMARY OF THE INVENTION

The present invention is directed to an apparatus and methods for cleaning test probes used in a semiconductor testing machine of the type having a plurality of test probes configured to contact the surface of a semiconductor wafer to test one or more dies formed thereon. The test probes being cleaned can be any type of probe, such as tungsten needles, vertical probes, cobra probes, L-type probes, plunger probes, spring probes, contact bump probes formed on a membrane, etc.

In a first embodiment, the cleaning apparatus of the present invention comprises an abrasive substrate layer and a tacky gel layer, positioned on the abrasive surface of the abrasive substrate layer.

A second embodiment of the invention is directed to a method for making the cleaning apparatus.

A third embodiment of the invention is directed to a method for cleaning probe tips.

A fourth embodiment of the invention is directed to the tacky gel layer of the cleaning apparatus.

A fifth embodiment of the invention is directed to a method for making the tacky gel layer of the cleaning apparatus.

DETAILED DESCRIPTION OF THE INVENTION

Table of Contents

I. Terminology of the Invention
II. The Cleaning Apparatus
  A. Abrasive Substrate Layer
  B. Tacky Gel Layer/Material
    1. Silicone Base Resin
    2. Cross-linking Compound
    3. Orientation of Components
III. Method of Making the Cleaning Apparatus
IV. Method for Cleaning Probe Tips I. Terminology of the Invention The term "probe tip" refers to the end portion of a probe element used for testing a semiconductor device.

The term "probe element" refers to, but is not limited to, tungsten needles, vertical probes, cobra probes, L-type probes, plunger probes, spring contact probes, and contact bump probes formed on a membrane.

The term "spring contact" (also referred to as a "contact spring" or as a "spring") refers to, but is not limited to, any spring contact available now or in the future from FormFactor, Inc. a Delaware corporation. Any type of spring contact presently known can be used in according with the present invention. Examples of spring contacts that can be used with the present invention are wirebond, multipart lithographic, and integrally formed springs.

The term "substrate" refers to a support material.

The term "abrasive substrate" refers to a support material having an abrasive surface.

The term "abrasive surface" refers to a non-smooth surface of an abrasive substrate.

The term "homogeneous abrasive substrate" refers to a substrate layer wherein the entire substrate layer (including the abrasive surface) is made of a single phase material.

The term "heterogeneous abrasive substrate" refers to an abrasive substrate layer made of at least two materials, wherein one of the materials forms a substrate layer, upon which at least one of the other materials, having an abrasive surface, is formed. The material making up the substrate layer and the layer having the abrasive surface are different materials.

II. The Cleaning Apparatus

Figure 1A:
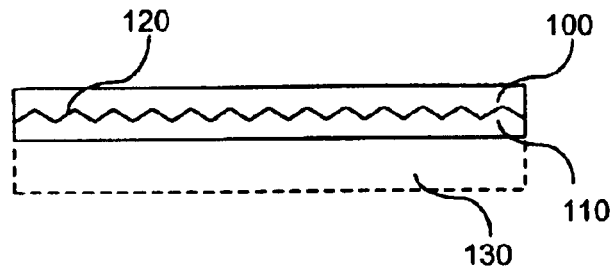
FIG. 1A shows a homogeneous cleaning apparatus.

FIG. 1A depicts a cleaning apparatus according to the first aspect of the invention which comprises: (i) an optional protective layer (130), as depicted by the dotted line; (ii) an abrasive substrate layer (110) positioned on top of the protective layer; and (iii) a tacky gel layer (100), positioned on top of the abrasive substrate layer (110). The surface abrasions or protrusions (120) are depicted by the saw-tooth pattern between the two layers. The depicted saw-tooth pattern, however, is not in any way intended to be limiting as to the configuration of the abrasive surface.

Where the cleaning apparatus is configured to include the optional protective substrate layer (130), the protective substrate layer protects the structural integrity of the probe tip, in the event that it penetrates through the abrasive substrate layer (110). Thus, upon penetration of the abrasive substrate layer (110), rather than contacting a hard surface (i.e., a surface upon which the cleaning apparatus of the invention may rest during operation), which could potentially damage the probe tip, the probe tip contacts a softer, more pliable material, that will not damage its physical integrity. For this embodiment, a suitable material for the protective substrate layer is, but is not limited to, a silicone based rubber material.

Figure 1B:
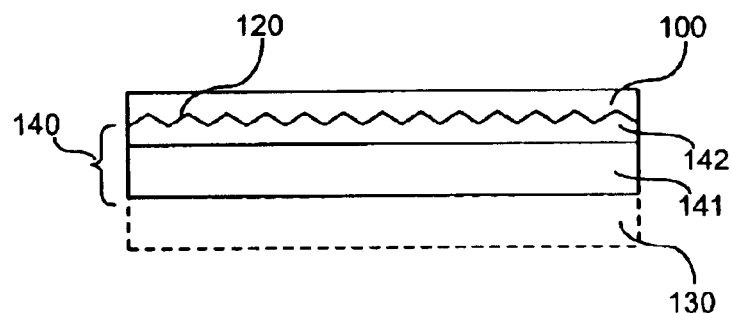
FIG. 1B shows a heterogeneous cleaning apparatus.

FIG. 1B depicts a cleaning apparatus comprising a heterogeneous abrasive substrate layer (140), having: (i) a substrate layer (141), upon which is laminated; (ii) an abrasive layer (142), made of a different material than the substrate layer (141), and having surface abrasions (120). Laminated on the surface of the abrasive substrate layer (140) is the tacky gel material (100). This configuration may also optionally contain a protective substrate layer (130) as described above.

Figure 1C:
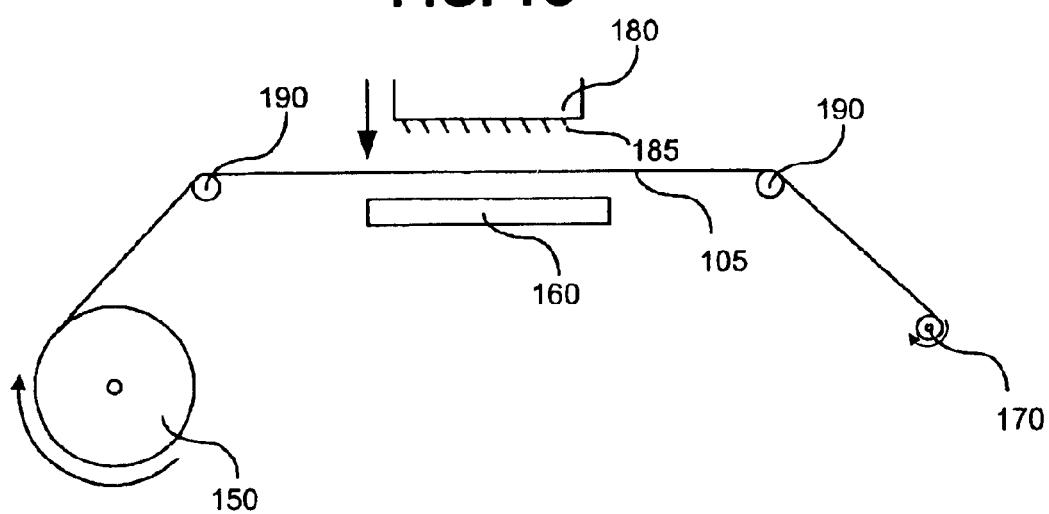
FIG. 1C shows a cleaning apparatus having the tacky gel layer on a spool and extended over the abrasive surface of an abrasive substrate.

FIG. 1C depicts a spool (150) containing the cleaning apparatus (105) according to FIG. 1A or 1B, being pulled across a platen (160) by an uptake spindle or roller (170). The platen (160) is a pressure acceptable plate (i.e., support surface) that allows the probe tips (180) to react against spooled cleaning apparatus (105). The probe card (180) containing probe tips (185) is positioned above the platen. Downward motion of the probe card (180) pushes the probe tips (185) through the tacky gel layer (100) so that the probe tips (185) come into contact with the abrasive surface of the abrasive substrate layer (110, 140) underneath the tacky gel layer (100). Rollers (190) are "positioning rollers" which assist in keeping the cleaning apparatus of FIG. 1A or 1B in a proper orientation over the platen (160). The configuration shown in FIG. 1C is not intended to be a limiting depiction of this aspect of the invention. Roller position for this aspect of the invention are not fixed, and may be adjusted or modified as deemed necessary by those of ordinary skill in the art, so as to maximize the effectiveness of the cleaning apparatus.

In an alternative configuration according to FIG. 1C, the platen (160) may have an abrasive surface, and the spool (150) may contain a cleaning apparatus (105) having the tacky gel material (100) supported on a flexible film. The tacky gel material (with the support film) is moved across the abrasive surface of the platen (160) to expose a fresh area of the tacky gel layer (100). The probes tips on the probed card are pressed through the tacky gel material (and support film) thereby making contact with the abrasive surface of the platen (160) in order to facilitate cleaning movements thereon.

In another alternative embodiment the spool (150) may contain a cleaning apparatus (105) having a homogeneous or heterogeneous abrasive substrate (110, 140), optionally supported on a protective substrate (130). Thus, no tacky gel layer (100) is associated with this configuration. In this configuration, the platen (160) is a support and does not have an abrasive surface.

In this aspect of the invention, the cycle of insertion and removal of the probe tips into and out of the tacky gel layer, over a period of time decreases the effectiveness of the tacky gel layer to remove debris from the probe tips. Therefore, rotation of the uptake spindle or roller, positions a fresh region of the tacky gel layer over the platen (160), thereby maximizing the cleaning effectiveness of the tacky gel layer (100). Once the tacky gel layer on spool is depleted, a fresh spool of tacky gel layer may be added, and the used tacky gel layer on uptake spindle may be discarded.

A. Abrasive Substrate Layer

The abrasive substrate layer in accord with the present invention, is typically any material that is as hard, or harder, than the type of debris to be cleaned from the probe tip, and typically, but not always soft enough not to damage the probe tip itself. In some cases, the material may be chosen to produce controlled or limited damage to the probe tip, which may be useful where a fresh surface is desired on the probe tip at periodic intervals. It may be a single material (110) (i.e., homogenous) or a combination of two or more materials (110 and 140) (i.e., heterogeneous). The abrasive substrate layer may also be made of the same material as the probe tip. Typically, the abrasive substrate layer may be made from any metal, metal alloy, composite compound, naturally occurring material or metal-organic compound.

While all metals of the transition metal series may be used to make the abrasive substrate, preferred transitions metals include, but are not limited to: copper, nickel, palladium, tungsten, rhenium, rhodium and cobalt.

Suitable alloys for use as abrasive substrates include, but are not limited to, alloys of any of the above-mentioned metals, which may contain phosphorus, nitrogen, boron and or similar materials. Specific examples of suitable metal alloys include, but are not limited to: palladium/cobalt, titanium/tungsten and molybdenum/chromium.

Suitable composite (i.e., polyatomic) compounds for use as abrasive substrates include, but are not limited to: tungsten carbide, silicon carbide, silicon nitride, silicon oxide, aluminum nitride, aluminum oxide, chrome oxide or titanium nitride.

Suitable naturally occurring materials for use as abrasive substrates include, but are not limited to: silica, alumina, diamond, or diamond-like carbon.

The surface characteristic of the abrasive substrate layer may be a series of random, semi-random or non-random abrasions on the surface of the substrate material. The abrasions may be prepared by: roughing of the substrate surface, plating up the substrate surface, etching, stamping, cutting into the substrate surface, or by using a mold, wherein one of the inner surfaces of the mold has an abrasive pattern. Other suitable means of making abrasions known to those of ordinary skill in the art, may be used in conjunction with this aspect of the invention. In one embodiment of the invention, the abrasions are prepared using at least two methods that are known to those of ordinary skill in the art for making abrasions on the surface of a substrate.

The shape of the abrasions may have a defined configuration, such as for example, any geometric shape obtained from a mold, stamp, etching or any other process which produces a uniform repeating pattern of projections. The abrasions are generally sized and shaped to provide abrasive characteristics. Typically, the size of the abrasions is smaller than the width of the probe tip. Preferably, the abrasions are small enough that several may lie across the width of a probe tip. Thus, the distance between abrasions is sufficiently small to accommodate such an arrangement.

Figure 2:
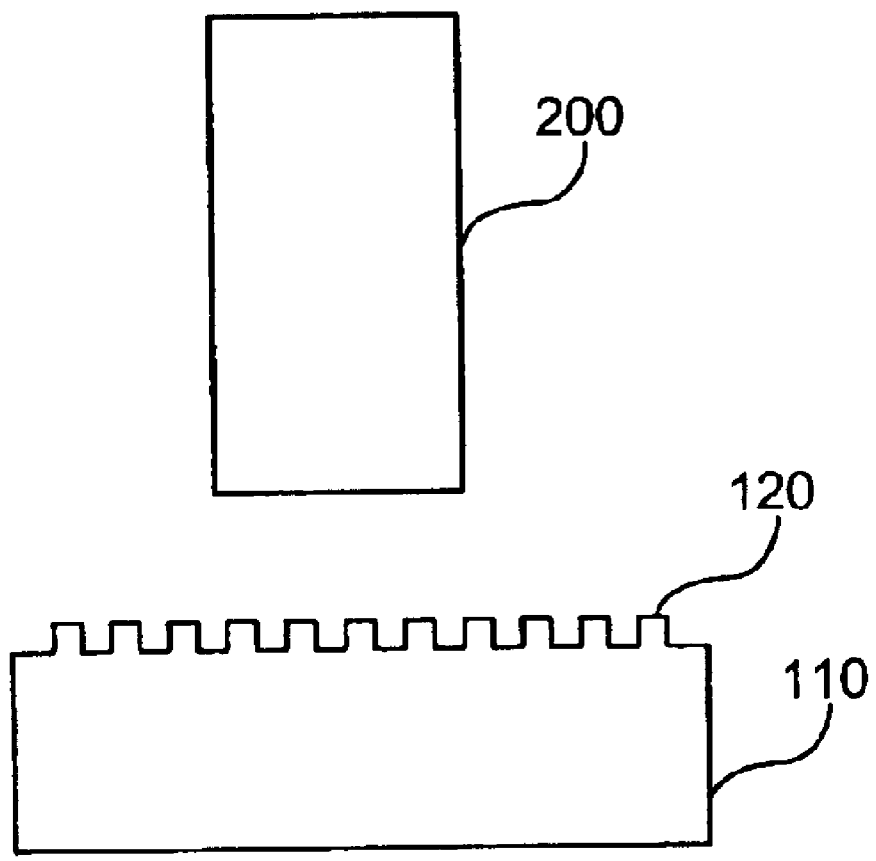
FIG. 2 depicts surface detail of the abrasive substrate, relative to a probe tip.

FIG. 2 depicts the cross-sectional size relation of the abrasions (120) with respect to the width of a probe tip (200). FIG. 2 also represents the abrasions (120) as having one of many possible configurations on the abrasive substrate layer (110). The depicted abrasions of FIG. 2 have a uniform repeating pattern and are relatively small in relation to the size of the probe tip. In an embodiment of the invention, the abrasions (120) exemplified in FIG. 2 have a width of about 2 $\mu$m, and the distance between the abrasions of about 2 $\mu$m. The probe tip (200) generally has a width of about 10 $\mu$m. These dimensions are illustrative, and are not intended to in any way limit the present invention.

In addition to the abrasions having geometrically uniform repeating patterns, they may also be fractal in nature, i.e., not having any geometrically defined shape. Such fractal abrasions are also known as dendritic. Dendritic abrasions may be made from any of the above-described materials useful for fabricating an abrasive substrate, by methods known to those of ordinary skill in the art.

An abrasive surface typography for the abrasive substrate layer may also be prepared by sputtering a film of a material, such as a metal, alloy, composite compound or naturally occurring compound, onto the surface of a hot substrate material. If the surface temperature of the substrate material is above the melt temperature of the material being deposited, the resulting deposit, once cooled, will have a rough surface typography. An abrasive substrate layer prepared in this manner would be heterogeneous, since it would comprise different material components. A rough surface prepared in this manner has a suitable abrasive surface characteristic for use with the present invention. Examples of materials that may be sputtered onto a hot substrate include, but are not limited to, aluminum, silicon, silicon carbide, and aluminum nitride.

In the event that the sputtered material is a soft metal, the roughness of the surface typography may be preserved by a subsequent deposit of a harder material, such as, for example: tungsten carbide, titanium nitride, diamond or diamond-like carbon.

Another method by which the abrasive surface characteristic may be obtained is by depositing a powder, particle, granule or crystal form of any of the above-described materials onto the surface of the substrate. The powder, particle or granular form of the applied material is typically mixed with a matrix material and then applied to the surface of the substrate. The abrasive surface of the substrate may also be prepared by growing crystals of the desired material on the surface of the substrate.

Additional methods for making the abrasive surface characteristic of the abrasive substrate layer include, but are not limited to: photo-etching, use of electro discharge machines (EDMs), laser etching, electroplating, sand blasting, chemical etching, molding, embossing, ion milling, electrodepositing, and sintering.

The above-described examples of methods for obtaining an abrasive surface on a substrate are not intended to be limiting with respect to the invention. Those of skill in the art will appreciate that any method of making an abrasive surface on a substrate is well suited for use in the present invention.

B. Tacky Gel Layer/Material

The tacky gel layer in accord with the present invention, is a first cleaning layer into which the probe tips are inserted. This cleaning layer is self-healing (i.e., the hole formed by insertion of the probe tip closes upon removal of the probe tip) and the tacky gel material will not adhere to the probe tip upon its insertion into and/or removal from the tacky gel layer.

The tacky gel layer comprises a mixture of:

(a) a silicone resin having the Formula I:

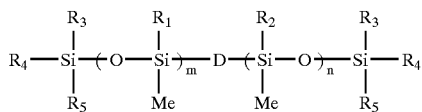

wherein:

$R_1$, $R_2$, $R_3$, $R_4$ and $R_5$ are independently selected from: hydrogen, $C_{1-6}$ alkyl, $C_{1-6}$ haloalkyl, vinyl or $C_{1-6}$ acryloxyalkyl, and at least one of $R_1$, $R_2$, $R_3$, $R_4$ and $R_5$ is a vinyl group;

D is a divalent linkage selected from the group consisting of: —O—, —S—, —(CH$_2$)$_r$CH$_2$—, —(CH$_2$)$_r$CH$_2$O— and —O(CH$_2$)$_r$CH$_2$—, wherein r is an integer from 0–10; and n and m are independently integers from about 0 to 1000, wherein the sum of m and n is not less than about 10; and (b) a cross-linking compound selected from:

(i) a compound having the Formula II:

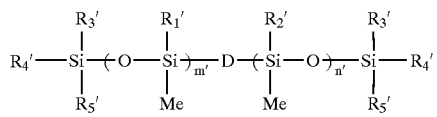

wherein, $R_{1'}$, $R_{2'}$, $R_{3'}$, $R_{4'}$, $R_{5'}$, m' and n' are independently selected from the groups defining $R_1$, $R_2$, $R_3$, $R_4$, $R_5$, m and n above, with the proviso that vinyl is not present; or (ii) a compound having the Formula III:

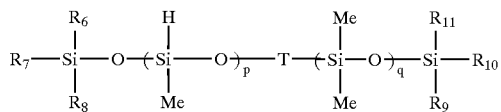

wherein:

$R_6$, $R_7$, $R_8$, $R_9$, $R_{10}$ and $R_{11}$ are independently selected from: hydrogen, $C_{1-20}$ alkyl, $C_{1-20}$ haloalkyl, phenyl or $C_{1-10}$ alkylphenyl;

p and q are independently integers from 0 to 800; and

T is selected from the group consisting of: a single bond, —(CH$_2$)$_t$CH$_2$—, —(CH$_2$)$_t$CH$_2$O— or

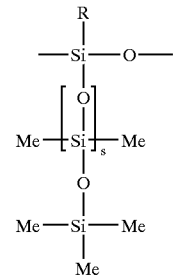

wherein:

t is an integer from 0–10; R is selected from: $C_{1-20}$ alkyl, $C_{1-20}$ haloalkyl, phenyl or $C_{1-10}$ alkylphenyl; and s is an integer from 0 to 800; and (c) a catalyst;

further wherein:

the chain length of the silicone base resin as defined by the sum of the values for m and n of Formula I, is always greater than the chain length of the cross-linking compound as defined by the sum of the values for m' and n' of Formula II, or the sum the values for p, q and s of Formula III.

Alternatively, the tacky gel layer may also be defined as a composition comprising a mixture of:

(a) a silicone base resin having a viscosity of from about 2000 to 10,000 centipoise (cps);

(b) a cross-linking compound having a viscosity of from about 2 to 1000 cps; and (c) a catalyst.

The chain length (i.e., size) of the silicone base resin is generally defined by the sum of the values of m and n of Formula I. Likewise, the size of the cross-linking compound is defined by the sum of the values of m' and n' of Formula II, or the sum of the values of p, q and s of Formula III.

Generally, in order to obtain the tacky gel layer's characteristics of self-healing and non-adherence to the probe tip, the length of the silicone base resin chain is always greater than the length of the cross-linking compound chain. Any ratio of silicone base resin length to cross-linking compound length that satisfies this requirement and provides the self-healing and non-adhesion to the probe tip characteristics to the tacky gel layer, is within the scope of the present invention. A typical non-limiting ratio of silicone base resin length to cross-linking compound length is about 10:1. Other ratios may be suitable, provide that the resulting mixture produces a tacky gel layer having the above-described characteristics. These characteristics may also be obtained by mixing the silicone base resin and the cross-linking compound having the respective viscosity as described above.

1. Silicone Base Resin

The compound of Formula I is a long chain silicone polymeric resin. Suitable long chain silicone polymer resins should exhibit a room temperature viscosity of from about 2000 to 10,000 cps and have a glass transition temperature of less than about minus 65° C. Thus, the values of n and m are selected such that the resulting compound corresponds to the desired viscosity for the long chain silicone polymer resins. Generally, for the long chain silicone polymer resins, the sum of the value for n and m are not less than about 10.

The silicone base resin should also be relatively pure, having not more than about 1% of low molecular weight contaminants and an outgassing value of less than about 0.5%. Such purity levels ensure that no contaminates are left on the probe tip upon removal of the probe from the gel.

Any silicone base resin of Formula I, corresponding to the above requirements, may be used in accord with the invention. Examples of suitable silicone base materials include, but are not limited to, Dow Corning 93-500, GE RTV567 (General Electric) and PS444 and PS802 (United Chemical Technologies).

2. Cross-Linking Compound

The cross-linking compound is a monomeric $C_{1-20}$ alkyl substituted hydrosiloxane compound, or a short to medium chain length hydrosiloxane oligomeric resin. Suitable short to medium chain length silicone oligomer resins should exhibit a room temperature viscosity of from about 2 to 1000 cps. Thus, for Formula II, the values of p, q and s are selected to correspond to the desired viscosity range for the cross-linking compound. Generally, for short to medium length oligomeric resins, the sum of the values for p, q and s is not greater than about 800. Suitable cross-linking compounds may be selected from, but are not limited to, PS123 and PS 542 (United Chemical Technologies), methylhydro-dimethylsiloxane, polymers and/or copolymers of hydrosiloxane.

The reaction of the silicon base resin, the cross-linking compound and the catalyst results in the desired gel characteristics of the tacky gel layer. Such characteristics include self-healing, tackiness, adhesion, stiffness, purity, and large operating temperature range. Each component of the mixture may be added separately to the reaction mixture that forms the gel, or the catalyst may be incorporated into the cross-linking compound prior to mixing with the silicone base resin.

The catalyst may be any catalyst that is useful for curing resins, polymers and the like, known to those of ordinary skill in the art. Suitable curing catalysts for use in accord with the present invention include, but are not limited to, platinum containing catalysts.

The amount of cross-linking compound mixed with the silicone base material is responsible for controlling the desired characteristics of the resulting tacky gel layer. It is therefore possible to tailor one or more of the above described gel characteristics by controlling the amount of the cross-linking compound. In accord with the embodiments of the present invention, from about 2.0 to 5.0 wt. % of cross-linker is added to the silicone base material in order to achieve the desired gel characteristics. Preferably, from about 2.0 to 3.0 wt. % of cross-linker is added to the silicone base material.

If the amount of cross-linking compound added to the silicone base resin is less than about 2.0 wt. %, the gel has a tendency to transfer to the probe tips upon entry into and removal from the tacky gel layer. Further, if the amount of cross-linker added to the silicone base resin is greater than about 5 wt. %, the gel is generally too hard to be effective for cleaning the probe tips.

The self-healing property of the tacky gel layer is defined as the ability of the gel to automatically close the hole made by the probe tip, upon removal of the probe therefrom. Generally, the gel material is expelled as the probe is inserted into the tacky gel layer, thereby creating a hole. Upon removal of the probe, the expelled gel flows back into the hole. It is preferred that the hole closes within about a few seconds, such that the flow of the gel back into the hole or holes, fills the hole to not less than about 50% of the original gel thickness.

Adhesion of the gel layer is determined using a 90-degree foil peel test. For this test, a sheet aluminum foil (1"×3") is laminated onto the gel, with the non-polished side in contact with the gel. The foil is attached to a clamp to which weights are added, and the weighted clamp peels the foil away from the gel at a 90-degree angle. Weight is added to the clamp until a peel rate of 2 inch/min is achieved. The total weight recorded at this rate is the gel adhesion value. Suitable adhesion values for the tacky gel material of the present invention are in the range of from about 0.10 to 100 g/inch.

Purity of the gel layer is defined by the amount of outgassing with the cured gel product. To be useful in the present invention, the cured tacky gel layer should have an outgassing percentage of about less than 0.5% of the total mass of the gel, as determined according to the American Society for Testing of Materials (ASTM), Method E595.

The tacky gel layer has an operating temperature range of from about minus 40° C. to 150° C. Within this temperature range, there should be little to no significant variation in the above described characteristics of the tacky gel layer.

The thickness of the tacky gel layer is generally slightly less than the length corresponding to the surface or area of the probe tip to be cleaned. This is the case so that the probe tips may penetrate through the tacky gel layer and make contact with the abrasive substrate layer below. Generally, the length of the probe tips to be cleaned ranges from about 1 to 250 $\mu$m. Thus, the thickness of the tacky gel layer ranges from about less than 1 $\mu$m to about 200 $\mu$m.

3. Orientation of Components

In accord with the second aspect of the invention, the cleaning apparatus is prepared by attaching the tacky gel layer (100) on top of the abrasive surface of a homogeneous abrasive substrate layer (110) or the abrasive surface layer of a heterogeneous abrasive substrate (140). Attachment of the tacky gel layer (100) onto the abrasive substrate layer (110, 140) may take place by transferring a preformed gel layer to the surface of the abrasive substrate, or by forming the gel layer on the surface of the abrasive substrate, by direct application of the silicone base resin/cross-linker/catalyst mixture to the abrasive surface of the abrasive substrate layer.

Typically, the spatial configuration of the cleaning apparatus of the invention is planar and may further be describes as a "pad" having a tacky gel layer (100) on top of an abrasive substrate layer (110, 140), as shown in FIGS. 1A and 1B.

Figure 3:
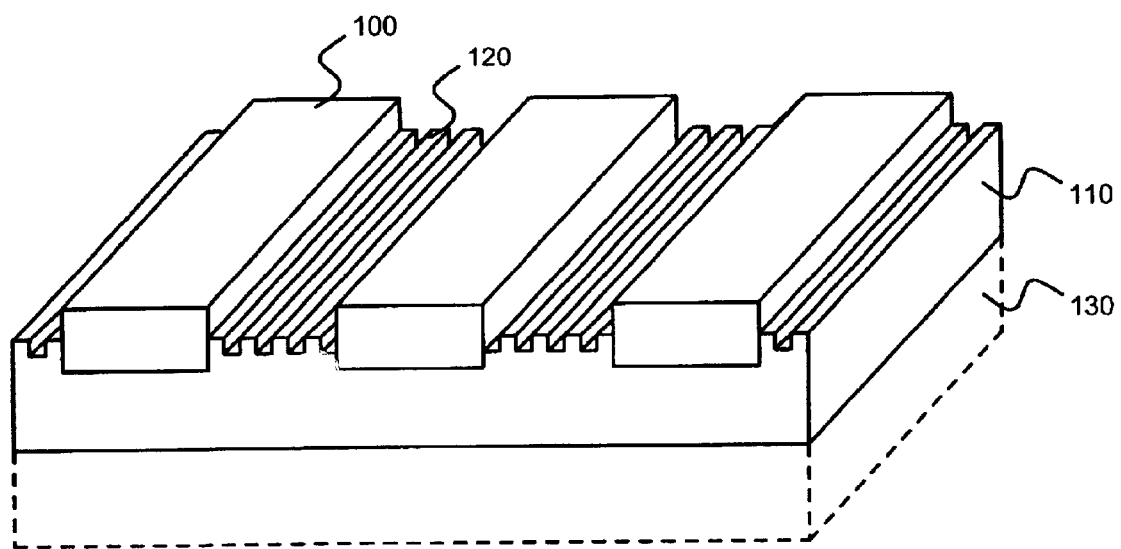
FIG. 3 shows a cleaning apparatus having alternating regions of tacky gel material and an abrasive surface.

In another embodiment of the invention, the pad may also be configured to have alternating regions of a tacky gel layer and an abrasive substrate layer. FIG. 3 shows a relief view of a cleaning apparatus pad according to the invention, wherein the pad has regions of a tacky gel material (100) separated by regions of exposed surface abrasions (120) of the abrasive substrate layer (110). The abrasive substrate layer (110) depicted in FIG. 3 is a homogeneous abrasive substrate layer. However, this configuration may also be prepared using a heterogeneous abrasive substrate layer (140) as shown in FIG. 1B. Both homogeneous and heterogeneous configurations may optionally be laminated on a protective substrate (130), as shown by the dotted line in FIG. 3.

Additionally, as shown in FIG. 3, the abrasive surface of the pad is a grooved pattern, wherein the grooves are aligned from the front to the back of the pad. This pattern is only a representative configuration. The grooved shaped abrasions may also be aligned on the pad from side to side (i.e., from left to right). During cleaning for this configuration, movement of the probe tip in this region of the cleaning pad follows the alignment direction of the grooves. Thus, the movement of the probe tip in the abrasive surface region of the pad is generally unidirectional.

Alternatively, for a cleaning pad according to the configuration shown in FIG. 3, (or as shown in FIG. 1A or 1B) the abrasive surface character of the abrasive substrate layer (110, 140) may also be selected from bumps, pillars, ridges, or roughness resulting from deposit of powders, particles, granules or crystals. In this aspect of the invention, the movement of the probe tip on the abrasive surface may be multidirectional. Generally, multidirectional movement may be obtained from any abrasive surface characteristic that does not confine movement of the probe tip to a single direction. In this sense, the phrase, "that does not confine movement of the probe tip," refers to any movement that, as deemed by those of ordinary skill in the art, would potentially damage the probe tip.

Where the surface abrasions of the abrasive substrate layer (110, 140) are, for example, bumps, pillars and/or ridges, if the abrasive surface has about the same hardness of the probe tip, it is preferred that the corners and/or edges of the surface abrasions be configured to be sharp. Conversely, if the surface abrasions of the abrasive substrate have a hardness greater than that of the probe tip, it is preferred that the corners and/or edges of the surface abrasions be configured to be rounded. Such configurations increase cleaning efficiency and also protect the probe tip from damage during the cleaning process.

Figure 4:
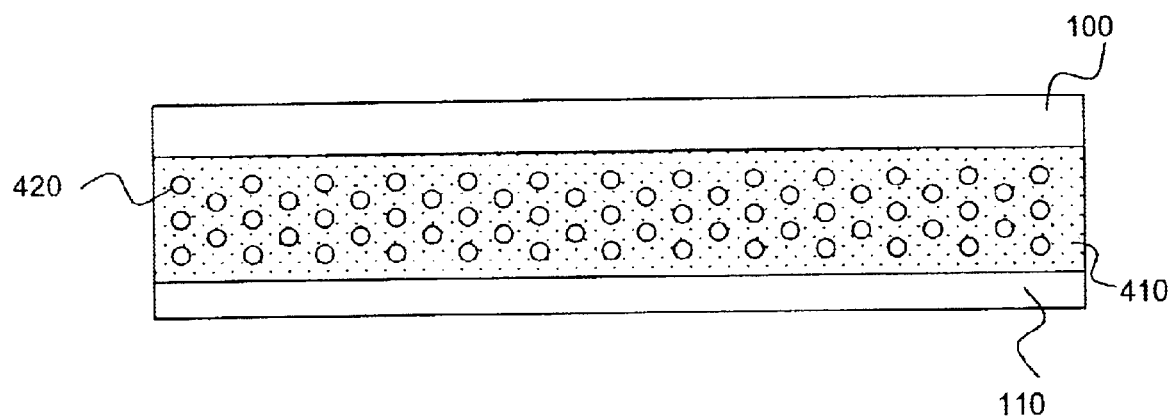
FIG. 4 shows a tacky gel layer laminated on top of an elastomeric resin layer having abrasive particles embedded therein.

FIG. 4 depicts another embodiment of the cleaning apparatus of the invention, wherein an elastomeric base material (410), having abrasive particles (420) dispersed and supported throughout the elastomeric base material (410), is laminated on a substrate layer (141). The substrate layer (141) may be any material discussed above for the abrasive substrate layer (110, 140). The tacky gel material (100) is laminated on the upper surface of the elastomeric base material (410).

The elastomeric base material (410) may be any material that has the ability to provide a support for the abrasive particles therein, and is pliable enough not to damage the probe tip upon insertion thereof into the elastomeric base material (410). A suitable non-limiting elastomeric base material may be a silicon based rubber material.

The abrasive particles (420) may be made from any material described above, that is useful for creating an abrasive surface, such as a metal, alloy, composite compound, or naturally occurring compound. The form of the abrasive particles may be a powder, granule, crystal, or any form suitable for providing an abrasive characteristic.

For any of the above-described configurations of the cleaning apparatus according to the invention, a removable protective film may also be applied to the surface of the tacky gel layer, which would be removed prior to use of the cleaning apparatus.

III. Method of Making the Cleaning Apparatus

Figure 5:
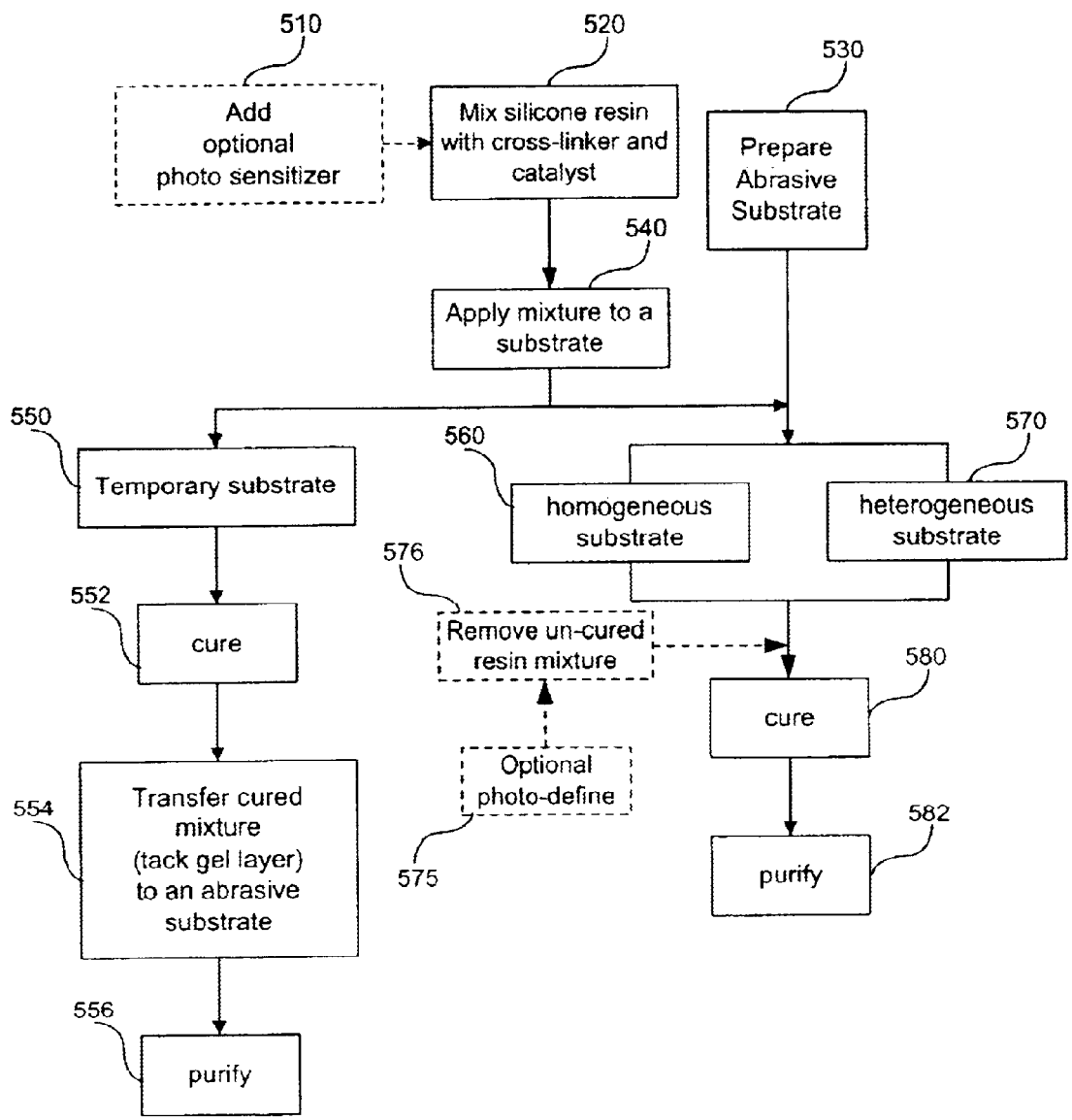
FIG. 5 show a method for making the cleaning apparatus according to present invention.

In accord with the second aspect of the invention, and as shown in FIG. 5, the cleaning apparatus is prepared in a first step, by mixing an amount of a silicone base resin with from about 2–5 wt. % of a cross-linking compound and an amount of a catalyst (520). The catalyst may be added separately or may be premixed with the cross-linking compound prior to mixing with the silicone base resin.

In a second step, the resulting resin/cross-linker/catalyst mixture may be applied to a temporary substrate (540 and 550) for transfer to the abrasive substrate layer (554), or it can be applied directly to the surface of the abrasive substrate layer (540, 560 and 570). Where a temporary substrate (550) is used, suitable temporary substrates include, but are not limited to: glass or polyethylene terephehalate (PET) films. Application of the mixture on either substrate is accomplished using known techniques including, but not limited to: spin coating, spray coating, casting, extruding or doctor blading.

Once the mixture is applied to the desired thickness on either of the temporary substrate or the abrasive substrate, the mixture is cured in a third step (552 or 580). The curing process may be any process suitable for curing the resin/cross-linker/catalyst mixture. Examples of suitable curing processes include, but are not limited to: heat-cure, photo-cure, or a combination of heat- and photo-cure.

The silicone base/cross-linker/catalyst mixture will self-cure, if left at room temperature for a period of at least about 48 hours. Where thermal cure is used, suitable ranges of curing temperature are from greater than room temperature to about 150° C., carried out within a time frame of from about 0.5 hours to about 48 hours. Generally, the curing time is inversely proportional to the curing temperature, thereby requiring less time at higher curing temperatures.

Where the gel layer is prepared on a temporary substrate (550), after curing, the gel is removed therefrom and transferred to the abrasive surface of the abrasive substrate layer (554). The tackiness of the gel layer has a sufficient adhesive characteristic to secure the gel layer to the surface of the abrasive substrate. In the case where the abrasive substrate is the same phase material as the probe tip, it is necessary to apply an additional adhesive layer to secure the gel layer to the surface of the abrasive substrate. A suitable additional adhesive layer may be similar to the resin/cross-linker/catalyst mixture discussed above, but has a lower cross-linker concentration. Typically, the cross-linker concentration for this additional adhesive layer is from about 0.5 to 2.0 wt. %.

Once the tacky gel layer has been applied to the substrate surface and cured, in a fourth step the resulting laminant is purified by heat treatment (556 or 582). During this step, outgassing occurs, which removes impurities from within the gel. This step may be executed as an optional step after curing by increasing the temperature, or by continuing to cure beyond that which is necessary to obtain a suitably cured product. It is, however, preferred to increase the temperature after heat curing.

Purification is generally carried out under a full or partial vacuum, which minimizes or eliminates the formation of bubbles in the tacky gel layer. A suitable purification temperature range is from about 100° C. to 180° C., for about 1 to 100 hours. Purification may also be carried out at pressures ranging from about atmospheric pressure to 0.001 torr.

Purification is measured in accord with the testing methods set forth by the American Society for Testing Materials (ASTM). Suitable gel layers for use with the present invention are those that display an outgassing percentage of less than about 0.5 wt. %, relative to the mass of the gel layer.

Where a cleaning apparatus in accord with FIG. 3 is desired, preparation of the abrasive substrate (530) may be carried out as described above. Following the formation of an abrasive surface on the substrate, the tacky gel material (100) may, for example, be applied directly to the abrasive surface of the substrate and patterned using a photo-defining step (575). The photo-defining step is a partial curing step, which defines the pattern of the tacky gel layer on the substrate. The photo-defining step may for example be carried out using a mask or any other suitable means of defining a pattern on a substrate, known to those of ordinary skill in the art. Upon completion of the photo-defining step, the uncured resin is removed (576), for example by washing, the remaining resin is cured again (580) and then purified (582). In accord with this embodiment, the rows of tacky gel material (100) rest on the surface abrasions (120) of the abrasive surface.

In an alternative embodiment, the rows of tacky gel material (100) may be partially embedded into the surface of the abrasive substrate (110). For this configuration, the abrasive substrate layer is prepared as described above (530). Generally, the resulting abrasive substrate layer (110) is then subjected to the following steps: (i) creating channels or grooves in the surface of the abrasive substrate (110); (ii) coating the tacky gel material (100) over the surface of the abrasive substrate (540), thereby filling the created channels or grooves; (iii) photo-defining the tacky gel material, for example through mask corresponding to the grooved regions of the abrasive substrate (575); (iv) removing the uncured tacky gel material (576); (v) curing the remaining partially cured tacky gel material (580); and (vi) purifying the resulting cured tacky gel material (582).

A photo-sensitive compound may also be added to the silicone base resin/cross-linker/catalyst mixture (510, 520), prior to applying the mixture to the surface of the abrasive substrate (540). The silicone base resin containing mixture may be made photo-sensitive by addition of compounds including, but not limited to, an acrylic or methacrylic containing polymer compound, such as (acryloxypropyl) methylsiloxane-dimethylsiloxane (PS802, United Chemical Technologies), in amounts of from about 0.5 wt. % to 60 wt. % of the silicone resin. Photo-initiators, such as dimethoxyphenyl acetophenone, may be added to the silicone base resin mixture in an amount of from about of from about 1.0 to 5.0 wt. % of the silicone base resin.

IV. Method for Cleaning Probe Tips

The debris produced during the process of testing the semiconductor wafers may be characterized as debris that clings loosely to the probes or as debris that clings more tightly to the probes. Nonlimiting examples of loose debris include debris that is transferred from the die surface to the side of the probe tip during movement of the probe tips associated testing of the wafers. A nonlimiting example of debris that more tightly clings to the probes includes debris that has been alloyed (i.e., fused) to the probes. Alloyed debris may result from the fusing of the pad material (from the wafer being tested) to the probe tip. This type of debris has a stronger attachment interaction than the loose debris generally attached to the side of the probe tip.

The cleaning apparatus of the present invention is well suited for the removal of both types of debris in a single cleaning cycle (i.e., insertion and removal of the probe tip into and out of the cleaning apparatus). Generally, the tacky gel layer removes loose debris (usually on the side of the probe tip) as the probe tip is inserted into the tacky gel layer. The debris that clings more tightly to the probes (e.g., alloyed or fused debris) is generally either loosened or removed as the probe tip is moved across the abrasive surface of the abrasive substrate. If such debris is removed as a result of the movement across the surface of the abrasive substrate, the debris will have a tendency to reside at or near the interface of the abrasive surface and the tacky gel layer. If instead the debris is, for example, not removed but rather loosened by movement across the abrasive surface of abrasive substrate, the tacky gel layer may remove the loosed debris from the probe tip as it exits the tacky gel layer.

Thus, in accord with the third embodiment of the invention, and as shown in FIGS. 6a through 6d, a method for cleaning probe tips is contemplated. Typically, a plurality of probe tips will be cleaned simultaneously, as they would be attached to a probe card.

Figure 6A:
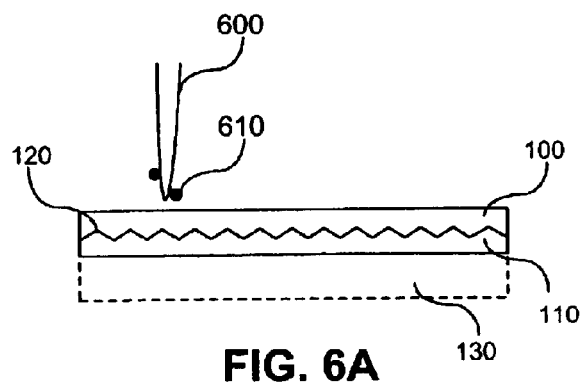
FIGS. 6A–6D show a method for cleaning a probe tip using a homogeneous cleaning apparatus according to FIG. 1A.
Figure 6B:
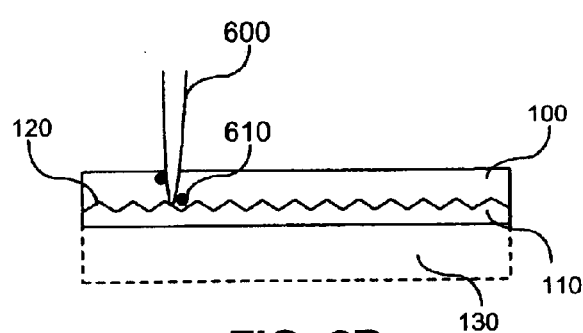
Figure 6C:
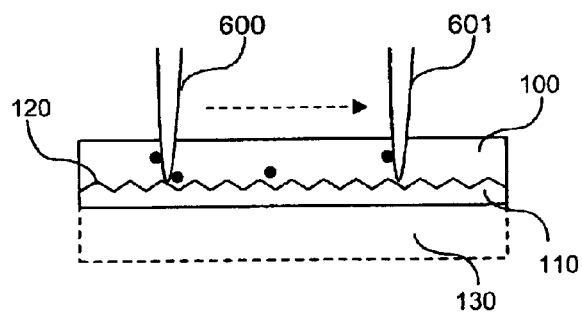
Figure 6D:
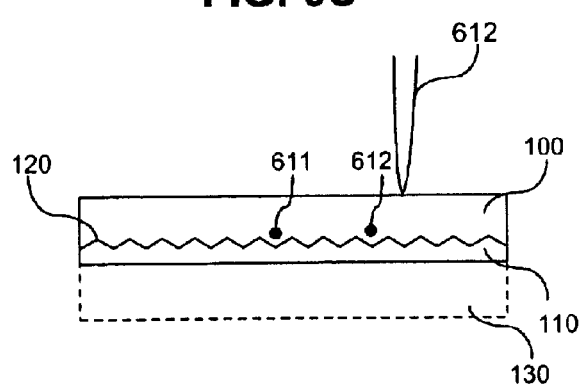

Generally, as shown in FIG. 6a and 6b, one or more probe tips (600) having debris (610) attached thereto, are pressed into and through the tacky gel material (100), so that they come in contact with the abrasive substrate layer (110). Upon contact with the surface of the abrasive substrate layer (110), the probe tips (600) are subjected to movement in the X-plane (i.e., the natural wipe direction), and an optional movement in the Y-plane. The X-movement may be slight or more pronounced, and is intended to allow the surface abrasions to dislodge debris (611) attached to the probe tip (601), as shown in FIG. 6c. Since the tacky gel layer (100) is self-healing, the X-movement of the probe tips does not produce unacceptable damage to the gel layer.

The probe tip (601) is then removed from the cleaning apparatus. As the probe tips are removed from the gel layer (100), debris (612) loosened by the abrasive surface of the substrate and still attached to the probe tip, adheres to the tacky gel layer, as the probe tip is retracted from the gel, in the Z direction. Thus, the probe tips (601) emerge from the tacky gel material free from any debris, in addition to being free of any tacky gel material.

The penetration and removal of the probe tips into and out of the gel layer constitutes one cleaning cycle. The cleaning method in accord with this invention is not limited to a specific number of cleaning cycles. The cleaning method may be repeated as many times as deemed necessary by those carrying out the method. Typically, the cycle may be repeated from about 1 to 1000 times. Should more than one cleaning cycle be used, subsequent penetrations of the probe tips need not be in the same location as the initial penetrations. Once retracted from the gel layer, either of the cleaning apparatus or probe tips may be moved relative to the other, so that a fresh area of the tacky gel layer may be subsequently penetrated.

In an alternative embodiment, the manner by which the probe tips are cleaned as described above in accord with FIG. 6, may be modified such that cleaning takes place without the probe tip contacting the abrasive surface (120) of the abrasive substrate. In this embodiment, the probe tip or tips, penetrate the surface of the tacky gel layer (100) without contacting the abrasive surface, undergo an X-movement through the tacky gel layer, and then are removed therefrom.

Figure 7A:
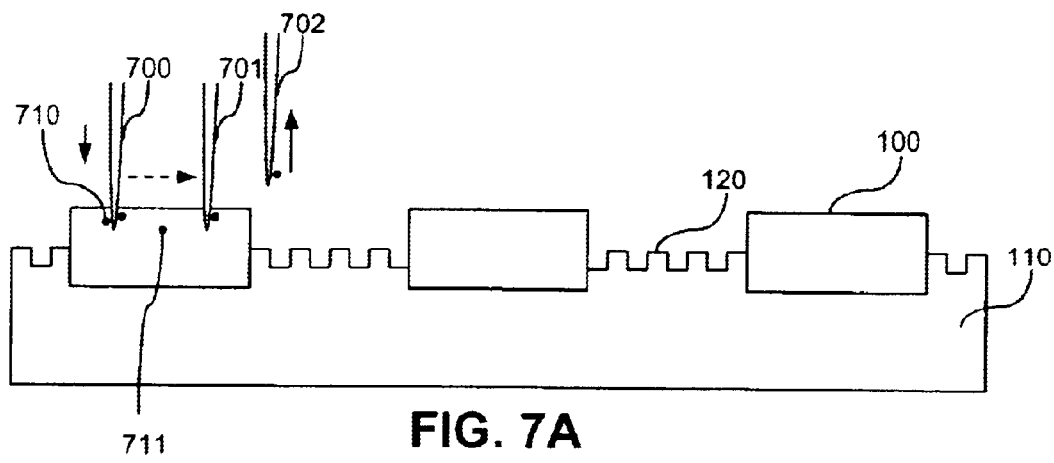
FIGS. 7A and 7B show a method for cleaning a probe tip using a cleaning apparatus according to FIG. 3.
Figure 7B:
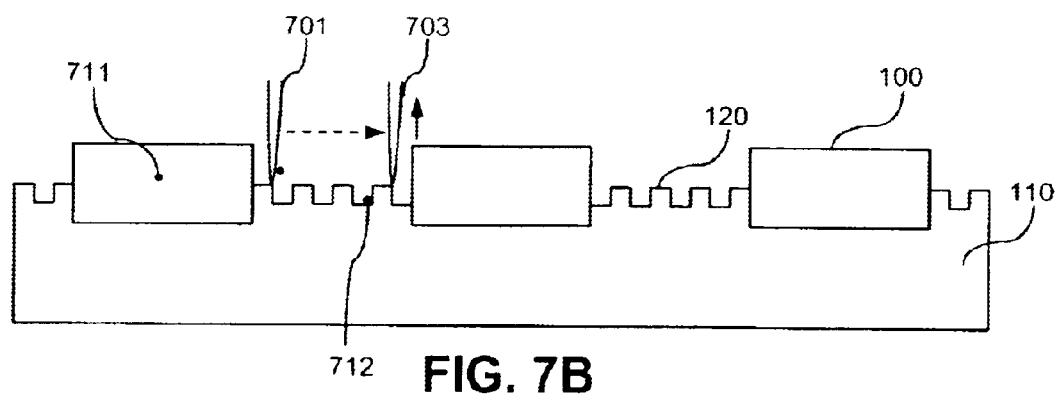

The cleaning apparatus having the configuration as described in FIG. 3, is cleaned in accord with FIGS. 7A and 7B, may be used to clean one or more probe tips in accord with the invention. This configuration is well suited for cleaning spring type probe tips such as those manufactured by FormFactor, Inc.

Generally, as shown in FIG. 7A, one or more probe tips (700) having debris (710) attached thereto, are brought into contact with one or more tacky gel layer regions (100), and then subjected to movement in the X-plane (701). Debris (711) is loosened and adheres to the tacky gel layer (100). The probe tip is removed from the tacky gel layer (100) and then positioned over the abrasive surface of the abrasive substrate (110) adjacent to the tacky gel layer (100). As shown in FIG. 7B, the probe tip (702) is then brought into contact with the surface abrasions (120) of the abrasive substrate (110) and moved in the X-direction (703) across the surface of the substrate. Debris (712) attached to the probe tip (702) is dislodged as a result of this movement. The probe tip (703) is then removed from the surface of the substrate.

This cleaning cycle may be repeated as many times as necessary, wherein the probe tips may alternate between contacting the gel regions and abrasive surfaces of the substrate. The probe tip, therefore, walks across the surface of the cleaning apparatus during cleaning cycles, alternating regions with each cycle.

When the probe tips are arranged in an array on a probe card, cleaning may occur such that one or more rows of probe tips will be in contact with the tacky gel layer (100), while one or more rows of probe tips will be in contact with the abrasive surface of the abrasive substrate layer. As the cleaning cycle proceeds, the starting positions of the individual rows of probe tips will alternate between gel regions (100) and surface abrasions (120), as may times as deemed necessary to achieve the desired level of cleaning.

Figure 8:
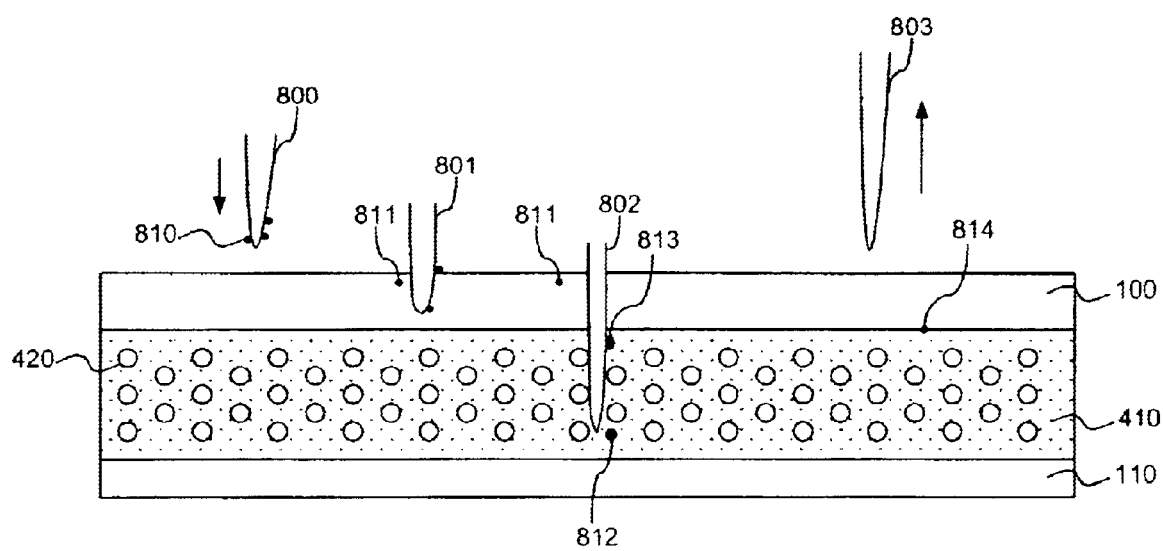
FIG. 8 shows a method for cleaning a probe tip using a cleaning apparatus according to FIG. 4.

FIG. 8 depicts the process for cleaning probe tips when using the cleaning apparatus of FIG. 4. In this embodiment, the probe tip (800) with debris (810) attached thereto, is inserted into the tacky gel layer (100). The tacky gel layer adheres to some of the debris (811) and dislodges it from the surface of probe tip (801). Probe tip (801, 802) is pushed through the tacky gel layer (100) into the elastomeric resin layer (410), which contains abrasive particles (420). As the probe tip comes into contact with the abrasive particles, the contact dislodges additional debris (812), which may remain in the elastomeric resin layer (410). Upon withdrawal of the probe tip (802, 803) from layers 410 and 100, respectively, any remaining debris (813) on the probe tip (802) may removed (814) by the tacky gel layer as the probe tip (803) exits layer (100). The cleaning cycle for this embodiment of the invention may also be repeated as often as deemed necessary by those of ordinary skill in the art.

In this aspect of the invention, movement of the probe tip in the X-plane is possible as long as the probe tip is within the tacky gel layer (100). Movement within the elastomeric resin layer is generally limited to the Z-plane because of the rigidity of the elastomeric layer and abrasive substrate particles therein.

The cleaning apparatus of the present invention may be packaged together with a probe card to form a kit. Preferably, the kit would comprise the cleaning apparatus in accord with the above-described embodiment of the present invention and a probe card.

Figure 9A:
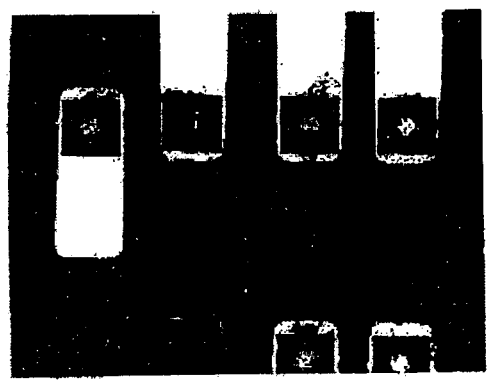
FIGS. 9A and 9B show probe tips, before and after cleaning with a cleaning apparatus according to an embodiment of the invention.
Figure 9B:
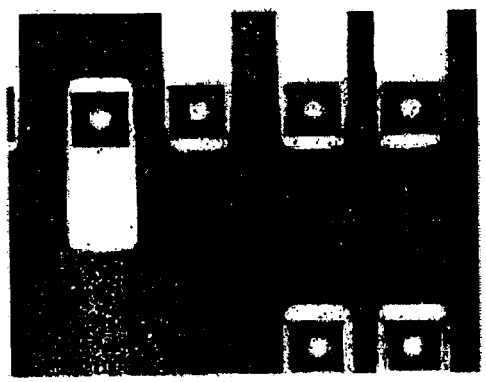

FIG. 9 shows the ability of the cleaning apparatus of the present invention to clean probe tips as described above. FIG. 9A shows probe tips prior to cleaning with the cleaning apparatus of the present invention. FIG. 9B shows the probe tips from FIG. 9A after cleaning with the cleaning apparatus of the present invention, which comprised Dow Corning 93-500 silicone resin mixed with 2.5% cross-linking compound, which is a low molecular weight dimethyl and hydromethylsiloxane copolymer.

While specific embodiments of the present invention have been described above, it should be understood that they have been presented by way of example only, and are not intended to be limiting. It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

All references cited within this disclosure are incorporated herein by reference.

What is claimed is:

1. A probe cleaning apparatus for cleaning the end portion of a probe used for testing a semiconductor wafer, comprising:
   (i) an abrasive substrate layer comprising a material for loosening debris on the end portion of a probe; and
   (ii) a tacky gel layer, wherein said tacky gel layer is in contact with a surface of the abrasive substrate layer; said tacky gel layer comprising:
      (a) a silicone base resin having the Formula I:

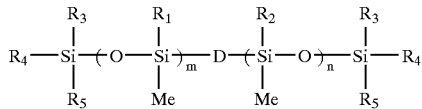

wherein:
$R_1$, $R_2$, $R_3$, $R_4$ and $R_5$ are independently selected from: hydrogen, $C_{1-6}$ alkyl, $C_{1-6}$ haloalkyl, vinyl or $C_{1-6}$ acryloxyalkyl, and at least one of $R_1$, $R_2$, $R_3$, $R_4$ and $R_5$ is a vinyl group;

D is a divalent linkage selected from the groups consisting of: —O—, —S—, —(CH$_2$)$_r$CH$_2$—, —(CH$_2$)$_r$CH$_2$O— and —O(CH$_2$)$_r$CH$_2$—, wherein r is an integer from 0–10;

n and m are independently integers from 0 to 1000, and the sum of n and m is not less than about 10; and (b) a cross-linking compound selected from:
   (i') a compound having the Formula II:

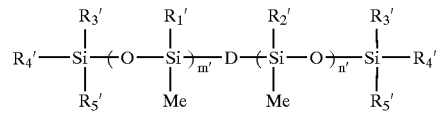

wherein, $R_{1'}$, $R_{2'}$, $R_{3'}$, $R_{4'}$, $R_{5'}$, m' and n' are independently selected from the groups defining $R_1$, $R_2$, $R_3$, $R_4$, $R_5$, m and n above, with the proviso that vinyl is not present in Formula II and that Formula II has at least two Si—H bonds; or (ii') a compound having the Formula III:

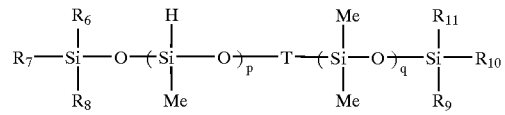

wherein:
$R_6$, $R_7$, $R_8$, $R_9$, $R_{10}$, and $R_{11}$ are independently selected from: hydrogen, $C_{1-20}$ alkyl, $C_{1-20}$ haloalkyl, phenyl or $C_{1-10}$ alkylphenyl, with the proviso that Formula III has at least two Si—H bonds;

p and q are independently integers from 0 to 800; and

T is selected from the group consisting of: a single bond, —(CH$_2$)$_1$CH$_2$—, —(CH$_2$)$_t$CH$_2$O— and

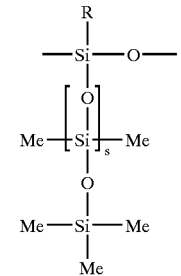

wherein:
t is an integer from 0–10; R is selected from: $C_{1-20}$ alkyl, $C_{1-20}$ haloalkyl, phenyl or $C_{1-10}$ alkylphenyl; and s is an integer from 0 to 800; and (c) a catalyst;
further wherein:
the chain length of the silicone base resin as defined by the sum of the values for in and n of Formula I, is always greater than the chain length of the cross-linking compound as defined by the sum of the values form m' and n' of Formula II, or the sum the values for p, q and s of Formula III.

2. The probe cleaning apparatus according to claim 1, wherein said abrasive substrate layer is comprised of a material selected from the group consisting of a transition metal, metal alloy, composite compound, and naturally occurring material.

3. The probe cleaning apparatus according to claim 2, wherein said material is in the form of a powder, particle, granule or crystal.

4. The probe cleaning apparatus according to claim 3, wherein said abrasive substrate layer is homogeneous or heterogeneous.

5. The probe cleaning apparatus according to claim 2, wherein said abrasive substrate layer is comprised of a transition metal selected from the group consisting of copper, nickel, palladium, tungsten, rhenium, rhodium, and cobalt.

6. The probe cleaning apparatus according to claim 2, wherein said abrasive substrate layer is comprised of a metal alloy selected from the group consisting of palladium/cobalt, molybdenum/chromium, and titanium/tungsten.

7. The probe cleaning apparatus according to claim 2, wherein said abrasive substrate layer is comprised of a composite compound selected from the group consisting of tungsten carbide, silicon carbide, silicon nitride, silicon oxide, aluminum nitride, chrome oxide, and titanium nitride.

8. The probe cleaning apparatus according to claim 2, wherein said abrasive substrate layer is comprised of a naturally occurring material selected from the group consisting of silica, alumina, diamond, and diamond-like carbon.

9. The probe cleaning apparatus according to claim 2, wherein said abrasive substrate layer comprises surface abrasions obtained from one or more selected from the group consisting of surface roughening, plating up, etching, stamping, cutting into the substrate surface, molding, and sputtering.

10. The probe cleaning apparatus according to claim 2, wherein said abrasive substrate layer is homogeneous and comprises a single material having an abrasive surface.

11. The probe cleaning apparatus according to claim 1, wherein for the silicone base resin of Formula I, the sum of m and n is from about 10 to 1000.

12. The probe cleaning apparatus according to claim 1, wherein D is oxygen.

13. The probe cleaning apparatus according to claim 1, wherein $R^3$ is vinyl.

14. The probe cleaning apparatus according to claim 13, wherein either of or both of $R^4$ and $R^5$ are methyl.

15. The probe cleaning apparatus according to claim 1, wherein the cross-linking compound has the Formula II.

16. The probe cleaning apparatus according to claim 15, wherein the silicone base resin has the Formula I, and $R^3$ is vinyl.

17. The probe cleaning apparatus according to claim 15, wherein for the silicone base resin of Formula I, either of, or both of $R^4$ and $R^5$ are methyl.

18. The probe cleaning apparatus according to claim 15, wherein the silicone base resin has the Formula I, and D is oxygen.

19. The probe cleaning apparatus according to claim 1, wherein the cross-linking compound has the Formula III, and the sum of p and q is from about 0 to 800.

20. The probe cleaning apparatus according to claim 19, wherein T is a single bond.

21. The probe cleaning apparatus according to claim 19, wherein $R^6$, $R^7$, $R^8$, $R^9$, $R^{10}$ and $R^{11}$ are methyl.

22. The probe cleaning apparatus according to claim 1, wherein said tacky gel layer is self-healing.

23. The probe cleaning apparatus according to claim 1, wherein the tacky gel layer comprises from about 2.0 to 5.0 wt. % of a cross-linking compound.

24. The probe cleaning apparatus according to claim 23, wherein said tacky gel layer comprises from about 2.0 to 3.0 wt. % of a cross-linking compound.

25. The probe cleaning apparatus according to claim 1, wherein the catalyst is a curing catalyst.

26. The probe cleaning apparatus according to claim 25, wherein the said curing catalyst is a platinum containing catalyst.

27. The probe cleaning apparatus according to claim 1, wherein said abrasive substrate layer comprises abrasions, wherein at least two of said abrasions have a spacing between said at least two abrasions, wherein said spacing is smaller than the width of a probe tip.

28. A probe cleaning apparatus for cleaning the end portion of a probe used for testing a semiconductor wafer, comprising:
(i) an abrasive substrate layer; and
(ii) a tacky gel layer, wherein said tacky gel layer is in contact with a surface of the abrasive substrate layer, said tacky gel layer comprising:
(a) a silicone base resin having the Formula I:

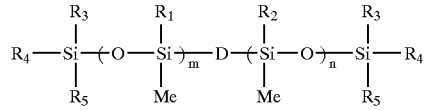

wherein:
$R_1$, $R_2$, $R_3$, $R_4$ and $R_5$ are independently selected from: hydrogen, $C_{1-6}$ alkyl, $C_{1-6}$ haloalkyl, vinyl or $C_{1-6}$ acryloxyalkyl, and at least one of $R_1$, $R_2$, $R_3$, $R_4$ and $R_5$ is a vinyl group;
D is a divalent linkage selected from the groups consisting of: —O—, —S—, —(CH$_2$)$_r$CH$_2$—, (CH$_2$)$_r$CH$_2$O— and —O(CH$_2$)$_r$CH$_2$—, wherein r is an integer from 0–10;
n and m are independently integers from 0 to 1000, and the sum of n and m is not less than about 10; and
(b) a cross-linking compound selected from:
(i') a compound having the Formula II:

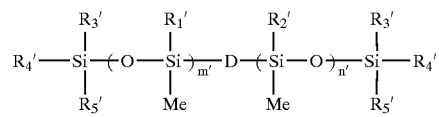

wherein, $R_{1'}$, $R_{2'}$, $R_{3'}$, $R_{4'}$, $R_{5'}$, m' and n' are independently selected from the groups defining $R_1$, $R_2$, $R_3$, $R_4$, $R_5$, m and n above, with the proviso that vinyl is not present in Formula II and that Formula II has at least two Si—H bonds; or
(ii') a compound having the Formula III:

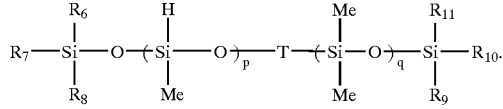

wherein:
$R_6$, $R_7$, $R_8$, $R_9$, $R_{10}$, and $R_{11}$ are independently selected from: hydrogen, $C_{1-20}$ alkyl, $C_{1-20}$ haloalkyl, phenyl or $C_{1-10}$ alkylphenyl, with the proviso that Formula III has at least two Si—H bonds;
p and q are independently integers from 0 to 800; and T is selected from the group consisting of: a single bond, —(CH$_2$)$_t$CH$_2$—, —(CH$_2$)$_t$CH$_2$O— and

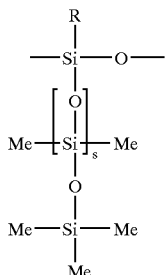

wherein:
t is an integer from 0–10: R is selected from: C$_{1-20}$ alkyl, C$_{1-20}$ haloalkyl, phenyl or C$_{1-10}$ alkylphenyl; and s is an integer from 0 to 800; and (c) a catalyst;
further wherein:
the chain length of the silicone base resin as defined by the sum of the values for m and n of Formula I, is always greater than the chain length of the cross-linking compound as defined by the sum of the values form m' and n' of Formula II, or the sum the values for p, q and s of Formula III; and
said apparatus further comprising alternating regions of said tacky gel layer and an abrasive surface.

29. The probe cleaning apparatus according to claim 28, wherein said alternating regions of the tacky gel layer rest on a surface of said abrasive substrate layer, or said alternating regions of the tacky gel layer are partially embedded in said abrasive substrate layer.

30. A probe cleaning apparatus for cleaning the end portion of a probe used for testing a semiconductor wafer, comprising:
(i) an abrasive substrate layer having an abrasive surface comprising dendritic patterned abrasions; and
(ii) a tacky gel layer, wherein said tacky gel layer is in contact with an abrasive surface of the abrasive substrate; said tacky gel layer comprising:
(a) a silicone base resin having the Formula I:

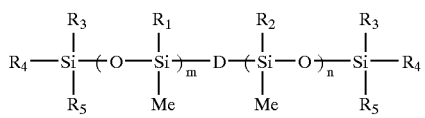

wherein:
R$_1$, R$_2$, R$_3$, R$_4$ and R$_5$ are independently selected from: hydrogen, C$_{1-6}$ alkyl, C$_{1-6}$ haloalkyl, vinyl or C$_{1-6}$ acryloxyalkyl, and at least one of R$_1$, R$_2$, R$_3$, R$_4$ and R$_5$ is a vinyl group;
D is a divalent linkage selected from the groups consisting of: —O—, —S—(CH$_2$)$_r$CH$_2$—, —(CH$_2$)$_r$CH$_2$O— and —O(CH$_2$)$_r$CH$_2$—, wherein r is an integer from 0–10;
n and m are independently integers from 0 to 1000, and the sum of n and m is not less than about 10; and (b) a cross-linking compound selected from:

(i') a compound having the Formula II:

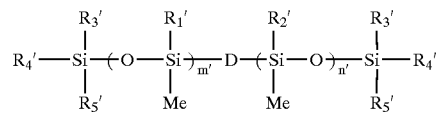

wherein, R$_{1'}$, R$_{2'}$, R$_{3'}$, R$_{4'}$, R$_{5'}$, m' and n' are independently selected from the groups defining R$_1$, R$_2$, R$_3$, R$_4$, R$_5$, m and n above, with the proviso that vinyl is not present in Formula II and that Formula II has at least two Si—H bonds; or (ii') a compound having the Formula III:

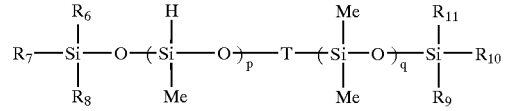

wherein:
R$_6$, R$_7$, R$_8$, R$_9$, R$_{10}$, and R$_{11}$ are independently selected from: hydrogen, C$_{1-20}$ alkyl, C$_{1-20}$ haloalkyl, phenyl or C$_{1-20}$ alkylphenyl, with the proviso that Formula III has at least two Si—H bonds;
p and q are independently integers from 0 to 800; and
T is selected from the group consisting of: a single bond, —(CH$_2$)$_t$CH$_2$—, —(CH$_2$)$_t$CH$_2$O— and

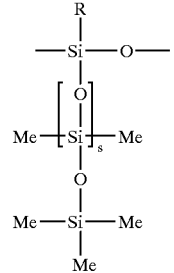

wherein:
t is an integer from 0–10; R is selected from: C$_{1-20}$ alkyl, C$_{1-20}$ haloalkyl, phenyl or C$_{1-10}$ alkylphenyl; and s is an integer from 0 to 800; and (c) a catalyst:
further wherein:
the chain length of the silicone base resin as defined by the sum of the values for m and n of Formula I, is always greater than the chain length of the cross-linking compound as defined by the sum of the values for m' and n' of Formula II, or the sum the values for p, q and s of Formula III.

31. The probe cleaning apparatus according to claim 30, wherein said dendritic patterned abrasions are the same material as the abrasive substrate, and said material is a transition metal.

32. The probe cleaning apparatus according to claim 31, wherein said transition metal is selected from the group consisting of: copper, nickel, palladium, tungsten, rhenium, rhodium and cobalt.

33. The probe cleaning apparatus according to claim 32, wherein said transition metal is copper.

34. The probe cleaning apparatus according to claim 32, wherein the dendritic patterned abrasions further comprise a coating of a harder material, wherein said coating has the same configuration as the dendritic abrasions.

35. The probe cleaning apparatus according to claim 34, wherein said harder material is selected from: tungsten carbide, titanium nitride, or diamond.

36. A probe cleaning apparatus for cleaning the end portion of a probe used for testing a semiconductor wafer, comprising:
   (i) an abrasive substrate layer comprising a material for loosening debris on the end portion of a probe; and
   (ii) a tacky gel layer, wherein said tacky gel layer is in contact with a surface of the abrasive substrate layer; said tacky gel layer comprising:
      (a) a vinyl siloxane containing silicone base resin having a viscosity of from about 2000 to 10,000 cps; and
      (b) a hydrosiloxane containing cross-linking compound having a viscosity of from about 2 to 1000 cps, wherein the cross-linking compound does not contain a vinyl group; and
      (c) a catalyst.

37. The probe cleaning apparatus according to claim 36, wherein said abrasive substrate layer is comprised of a material selected from the group consisting of a transition metal, metal alloy, composite compound, and naturally occurring material.

38. The probe cleaning apparatus according to claim 37, wherein said material is in the form of a powder, particle, granule or crystal.

39. The probe cleaning apparatus according to claim 38, wherein said abrasive substrate layer is homogeneous or heterogeneous.

40. The probe cleaning apparatus according to claim 37, wherein said abrasive substrate layer is comprised of a transition metal selected from the group consisting of copper, nickel, palladium, tungsten, rhenium, rhodium, and cobalt.

41. The probe cleaning apparatus according to claim 37, wherein said abrasive substrate layer is comprised of a metal alloy selected from the group consisting of palladium/cobalt, molybdenum/chromium, and titanium/tungsten.

42. The probe cleaning apparatus according to claim 37, wherein said abrasive substrate layer is comprised of a composite compound selected from the group consisting of tungsten carbide, silicon carbide, silicon nitride, silicon oxide, aluminum nitride, chrome oxide, and titanium nitride.

43. The probe cleaning apparatus according to claim 37, wherein said abrasive substrate layer is comprised of a naturally occurring material selected from the group consisting of silica, alumina, diamond, and diamond-like carbon.

44. The probe cleaning apparatus according to claim 36, wherein said abrasive substrate layer comprises surface abrasions obtained from one or more selected from the group consisting of surface roughening, plating up, etching, stamping, cutting into the substrate surface, molding, and sputtering.

45. The probe cleaning apparatus according to claim 36, wherein said tacky gel layer is self-healing.

46. The probe cleaning apparatus according to claim 36, wherein the tacky gel layer comprises from about 2.0 to 5.0 wt. % of a cross-linking compound.

47. The probe cleaning apparatus according to claim 46, wherein said tacky gel layer comprises from about 2.0 to 3.0 wt. % of a cross-linking compound.

48. The probe cleaning apparatus according to claim 36, wherein the catalyst is a curing catalyst.

49. The probe cleaning apparatus according to claim 48, wherein the said curing catalyst is a platinum containing catalyst.

50. The probe cleaning apparatus according to claim 36, wherein said abrasive substrate layer comprises abrasions, wherein at least two of said abrasions have a spacing between said at least two abrasions, wherein said spacing is smaller than the width of a probe tip.

51. A probe cleaning apparatus for cleaning the end portion of a probe used for testing a semiconductor wafer, comprising:
   (i) an abrasive substrate layer; and
   (ii) a tacky gel layer, wherein said tacky gel layer is in contact with a surface of the abrasive substrate layer, said tacky gel layer comprising:
      (a) a vinyl siloxane containing silicone base resin having a viscosity of from about 2000 to 10,000 cps; and
      (b) a hydrosiloxane containing cross-linking compound having a viscosity of from about 2 to 1000 cps, wherein the cross-linking compound does not contain a vinyl group; and
      (c) a catalyst; and
   said apparatus further comprising alternating regions of a said tacky gel layer and an abrasive surface.

52. The probe cleaning apparatus according to claim 28, wherein said alternating regions of the tacky gel layer rest on a surface of said abrasive substrate layer, or said alternating regions of the tacky gel layer are partially embedded in said abrasive substrate layer.

53. A probe cleaning apparatus for cleaning the end portion of a probe used for testing a semiconductor wafer, comprising:
   (i) an abrasive substrate layer having an abrasive surface comprising dendritic patterned abrasions; and
   (ii) a tacky gel layer, wherein said tacky gel layer is in contact with an abrasive surface of the abrasive substrate; said tacky ad layer comprising:
      (a) a vinyl siloxane containing silicone base resin having a viscosity of from about 2000 to 10.000 cps; and
      (b) a hydrosiloxane containing cross-linking compound having a viscosity of from about 2 to 1000 cps, wherein the cross-linking compound does not contain a vinyl group; and
      (c) a catalyst.

54. The probe cleaning apparatus according to claim 53, wherein said dendritic patterned abrasions are the same material as the abrasive substrate, and said material is a transition metal.

55. The probe cleaning apparatus according to claim 54, wherein said transition metal is selected from the group consisting of: copper, nickel, palladium, tungsten, rhenium, rhodium and cobalt.

56. The probe cleaning apparatus according to claim 55, wherein said transition metal is copper.

57. The probe cleaning apparatus according to claim 53, wherein the dendritic patterned abrasions further comprise a coating of a harder material, wherein said coating has the same configuration as the dendritic abrasions.

58. The probe cleaning apparatus according to claim 57, wherein said harder material is selected from: tungsten carbide, titanium nitride, or diamond.

59. A probe cleaning apparatus for cleaning the end portion of a probe used for testing a semiconductor wafer, comprising:
   (i) an abrasive substrate layer; and
   (ii) a tacky gel layer, wherein said tacky gel layer is in contact with a surface of the abrasive substrate layer, said tacky gel layer comprising:

(a) a silicone base resin having the Formula I:

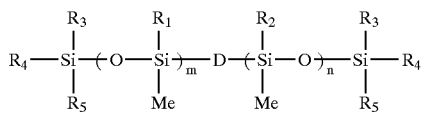

wherein:
$R_1$, $R_2$, $R_3$, $R_4$ and $R_5$ are independently selected from: hydrogen, $C_{1-6}$ alkyl, $C_{1-6}$ haloalkyl, vinyl or $C_{1-6}$ acryloxyalkyl, and at least one of $R_1$, $R_2$, $R_3$, $R_4$ and $R_5$ is a vinyl group;
D is a divalent linkage selected from the groups consisting of: —O—, —S—, —$(CH_2)_rCH_2$—, —$(CH_2)_rCH_2O$— and —$O(CH_2)_rCH_2$—, wherein r is an integer from 0–10;
n and m are independently integers from 0 to 1000, and the sum of n and m is not less than about 10; and
(b) a cross-linking compound selected from:
(i') a compound having the Formula II:

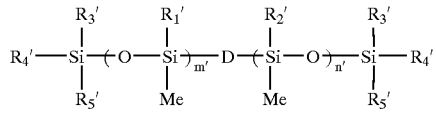

wherein, $R_{1'}$, $R^{2'}$, $R_{3'}$, $R_{4'}$, $R_{5'}$, m' and n' are independently selected from the groups defining $R_1$, $R_2$, $R_3$, $R_4$, $R_5$, m and n above, with the proviso that vinyl is not present in Formula II and that Formula II has at least two Si—H bonds; or
(ii') a compound having the Formula III:

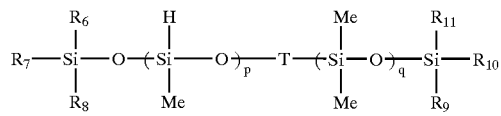

wherein:
$R_6$, $R_7$, $R_8$, $R_9$, $R_{10}$, and $R_{11}$ are independently selected from: hydrogen, $C_{1-20}$ alkyl, $C_{1-20}$ haloalkyl, phenyl or $C_{1-10}$ alkylphenyl, with the proviso that Formula III has at least two Si—H bonds;
p and q are independently integers from 0 to 800; and
T is selected from the group consisting of: a single bond, —$(CH_2)_rCH_2$—, —$(CH_2)_rCH_2O$—and

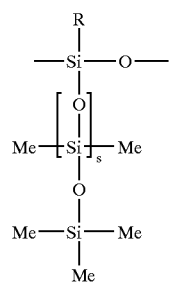

wherein:
t is an integer from 0–10; R is selected from: $C_{1-20}$ alkyl, $C_{1-20}$ haloalkyl, phenyl or $C_{1-10}$ alkylphenyl; and s is an integer from 0 to 800; and (c) a catalyst;
further wherein:
the chain length of the silicone base resin as defined by the sum of the values for m and n of Formula I, is always greater than the chain length of the cross-linking compound as defined by the sum of the values for m' and n' of Formula II, or the sum the values for p, q and s of Formula III; and
wherein said abrasive substrate is applied on top of a protective substrate.

60. A probe cleaning apparatus for cleaning the end portion of a probe used for testing a semiconductor wafer, comprising:
(i) an abrasive substrate layer; and
(ii) a tacky gel layer, wherein said tacky gel layer is in contact with a surface of the abrasive substrate layer, said tacky gel layer comprising:
(a) a silicone base resin having the Formula I:

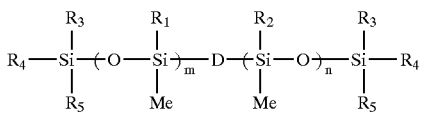

wherein:
$R_1$, $R_2$, $R_3$, $R_4$ and $R_5$ are independently selected from: hydrogen, $C_{1-6}$ alkyl $C_{1-6}$ haloalkyl, vinyl or $C_{1-6}$ acryloxyalkyl, and at least one of $R_1$, $R_2$, $R_3$, $R_4$ and $R_5$ is a vinyl group;
D is a divalent linkage selected from the groups consisting of: —O—, —S—, —$(CH_2)_rCH_2$—, —$(CH_2)_rCH_2O$— and —$O(CH_2)_rCH_2$—, wherein r is an integer from 0–10;
n and m are independently integers from 0 to 1000, and the sum of n and m is not less than about 10; and
(b) a cross-linking compound selected from:
(i') a compound having the Formula II:

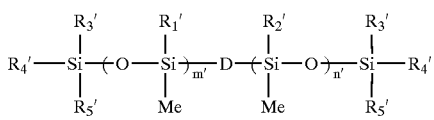

wherein, $R_{1'}$, $R_{2'}$, $R_{3'}$, $R_{4'}$, $R_{5'}$, m' and n' are independently selected from the groups defining $R_1$, $R_2$, $R_3$, $R_4$, $R_5$, m and n above, with the proviso that vinyl is not present in Formula II and that Formula II has at least two Si—H bonds; or
(ii') a compound having the Formula III:

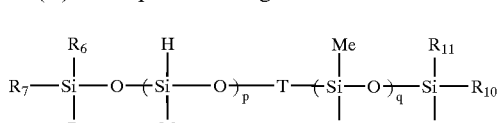

wherein:
$R_7$, $R_8$, $R_9$, $R_{10}$, and $R_{11}$ are independently selected from: hydrogen, $C_{1-20}$ alkyl, $C_{1-20}$ haloalkyl, phenyl or $C_{1-10}$ alkylphenyl, with the proviso that Formula III has at least two Si—H bonds;
p and p are independently integers from 0 to 800; and T is selected from the group consisting of: a single bond, —(CH$_2$)$_t$CH$_2$—, —(CH$_2$)$_t$CH$_2$O— and

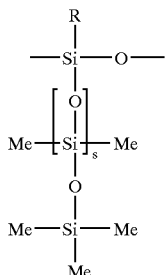

wherein:
t is an integer from 0–10; R is selected from: C$_{1-20}$ alkyl, C$_{1-20}$ haloalkyl, phenyl or C$_{1-10}$ alkylphenyl; and s is an integer from 0 to 800; and (c) a catalyst:
further wherein:
the chain length of the silicone base resin as defined by the sum of the values for m and n of Formula I, is always greater than the chain length of the cross-linking compound as defined by the sum of the values form m' and n' of Formula II, or the sum the values for p, q and s of Formula III; and
wherein said abrasive substrate layer is heterogeneous and comprises:
(A) a first layer of a material, and
(B) a second layer of a different material than said first layer, having an abrasive surface.

61. A probe cleaning apparatus for cleaning the end portion of a probe used for testing a semiconductor wafer, comprising:
(i) an abrasive substrate layer; and
(ii) a tacky gel layer, wherein said tacky gel layer is in contact with a surface of the abrasive substrate layer, said tacky gel layer comprising:
(a) a silicone base resin having the Formula I:

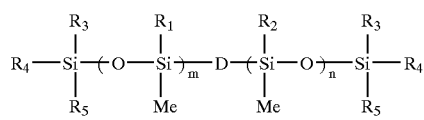

wherein:
R$_1$, R$_2$, R$_3$, R$_4$ and R$_5$ are independently selected from: hydrogen, C$_{1-6}$ alkyl, C$_{1-6}$ haloalkyl, vinyl or C$_{1-6}$ acryloxyalkyl, and at least one of R$_1$, R$_2$, R$_3$, R$_4$ and R$_5$ is a vinyl group;
D is a divalent linkage selected from the groups consisting of: —O—, —S—, —(CH$_2$)$_r$CH$_2$—, —(CH$_2$)$_r$CH$_2$O— and —O(CH$_2$)$_r$CH$_2$—, wherein r is an integer from 0–10;
n and m are independently integers from 0 to 1000, and the sum of n and m is not less than about 10; and
(b) a cross-linking compound selected from:

(i') a compound having the Formula II:

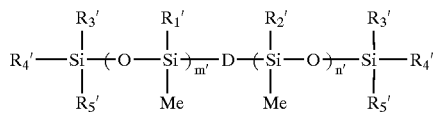

wherein, R$_{1'}$, R$_{2'}$, R$_{3'}$, R$_{4'}$, R$_{5'}$, m' and n' are independently selected from the groups defining R$_1$, R$_2$, R$_3$, R$_4$, R$_5$, m and n above, with the proviso that vinyl is not present in Formula II and that Formula II has at least two Si—H bonds; or
(ii') a compound having the Formula III:

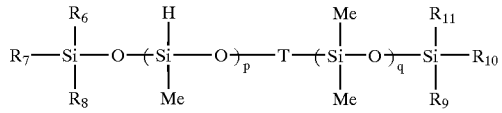

wherein:
R$_6$, R$_7$, R$_8$, R$_9$, R$_{10}$, and R$_{11}$ are independently selected from: hydrogen, C$_{1-20}$ alkyl, C$_{1-20}$ haloalkyl, phenyl or C$_{1-10}$ alkylphenyl, with the proviso that Formula III has at least two Si—H bonds;
p and q are independently integers from 0 to 800; and
T is selected from the group consisting of: a single bond, —(CH$_2$)$_t$CH$_2$—, —(CH$_2$)$_t$CH$_2$O— and

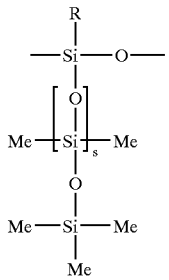

wherein:
t is an integer from 0–10; R is selected from: C$_{1-20}$ alkyl, C$_{1-20}$ haloalkyl, phenyl or C$_{1-10}$ alkylphenyl; and s is an integer from 0 to 800: and (c) a catalyst;
further wherein:
the chain length of the silicone base resin as defined by the sum of the values for m and n of Formula I, is always greater than the chain length of the cross-linking compound as defined by the sum of the values form m' and n' of Formula II, or the sum the values for p, q and s of Formula III; and
said apparatus further comprising a removable protective film applied to the surface of the tacky gel layer.

62. A probe cleaning apparatus for cleaning the end portion of a probe used for testing a semiconductor wafer, comprising:
(i) an abrasive substrate layer; and
(ii) a tacky gel layer, wherein said tacky gel layer is in contact with a surface of the abrasive substrate layer, said tacky gel layer comprising:

(a) a vinyl siloxane containing silicone base resin having a viscosity of from about 2000 to 10,000 cps; and (b) a hydrosiloxane containing cross-linking compound having a viscosity of from about 2 to 1000 cps, wherein the cross-linking compound does not contain a vinyl group; and (c) a catalyst; and said apparatus further comprising a removable protective film applied to the surface of the tacky gel layer.

63. A probe cleaning apparatus for cleaning the end portion of a probe used for testing a semiconductor wafer, comprising:

(i) an abrasive substrate layer; and (ii) a tacky gel layer, wherein said tacky gel layer is in contact with a surface of the abrasive substrate layer, said tacky gel layer comprising:

(a) a silicone base resin having the Formula 1:

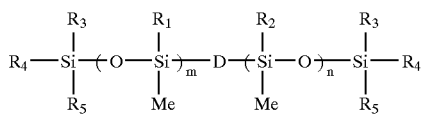

wherein:

$R_1$, $R_2$, $R_3$, $R_4$ and $R_5$ are independently selected from: hydrogen $C_{1-6}$ alkyl, $C_{1-6}$ haloalkyl, vinyl or $C_{1-6}$ acryloxyalkyl, and at least one of $R_1$, $R_2$, $R_3$, $R_4$ and $R_5$ is a vinyl group;

D is a divalent linkage selected from the groups consisting of: —O—, —S—, —(CH$_2$)$_r$CH$_2$—, —(CH$_2$)$_r$CH$_2$O— and —O(CH$_2$)$_r$CH$_2$—, wherein r is an integer from 0–10;

n and m are independently integers from 0 to 1000, and the sum of n and m is not less than about 10; and (b) a cross-linking compound selected from:

(i) a compound having the Formula II:

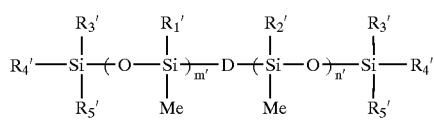

wherein $R_1'$, $R_2'$, $R_3'$, $R_4'$, $R_5'$, m' and n' are independently selected from the groups defining $R_1$, $R_2$, $R_3$, $R_4$, $R_5$, m and n above, with the proviso that vinyl is not present in Formula II and that Formula II has at least two Si-H bonds; or (ii') a compound having the Formula III:

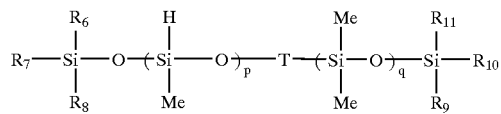

wherein:

$R_6$, $R_7$, $R_8$, $R_9$, $R_{10}$, and $R_{11}$ are independently selected from: hydrogen, $C_{1-20}$ alkyl, $C_{1-20}$ haloalkyl, phenyl or $C_{1-10}$ alkylphenyl, with the proviso that Formula III has at least two Si—H bonds;

p and q are independently integers from 0 to 800; and

T is selected from the group consisting of: a single bond, —(CH$_2$)$_t$CH$_2$—, —(CH$_2$)$_t$CH$_2$O— and

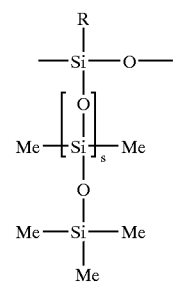

wherein:

t is an integer from 0–10; R is selected from: $C_{1-20}$ alkyl, $C_{1-20}$ haloalkyl, phenyl or $C_{1-10}$ alkylphenyl; and s is an integer from 0 to 800; and (c) a catalyst;

further wherein:

the chain length of the silicone base resin as defined by the sum of the values for m and n of Formula I, is always greater than the chain length of the cross-linking compound as defined by the sum of the values for m' and n' of Formula II, or the sum the values for p, q and s of Formula III.

64. A probe cleaning apparatus for cleaning the end portion of a probe used for testing a semiconductor wafer, comprising:

(I) an abrasive substrate layer; and (ii) a tacky gel layer, wherein said tacky gel layer is in contact with a surface of the abrasive substrate layer, said tacky gel layer comprising:

(a) a vinyl siloxane containing silicone base resin having a viscosity of from about 2000 to 10,000 cps; and (b) a hydrosiloxane containing cross-linking compound having a viscosity of from about 2 to 1000 cps, wherein the cross-linking compound does not contain a vinyl group; and (c) a catalyst.

* * * * *